US008968474B2

(12) United States Patent
Lim et al.

(10) Patent No.: US 8,968,474 B2
(45) Date of Patent: Mar. 3, 2015

(54) SUBSTRATE PROCESSING APPARATUS AND METHOD OF DISASSEMBLING AND ASSEMBLING THE SAME

(75) Inventors: Kun-Young Lim, Uiwang-si (KR); Do-Hyung Kim, Seoul (KR); Ju-Ill Lee, Gwangju-si (KR)

(73) Assignee: Jusung Engineering Co., Ltd. (KR)

(*) Notice: Subject to any disclaimer, the term of this patent is extended or adjusted under 35 U.S.C. 154(b) by 617 days.

(21) Appl. No.: 13/244,535

(22) Filed: Sep. 25, 2011

(65) Prior Publication Data

US 2012/0091871 A1    Apr. 19, 2012

(30) Foreign Application Priority Data

Oct. 18, 2010  (KR) .................. 10-2010-0101357

(51) Int. Cl.
| | | |
|---|---|---|
| *C23C 16/44* | (2006.01) | |
| *C23F 1/00* | (2006.01) | |
| *H01L 21/306* | (2006.01) | |
| *H01L 21/67* | (2006.01) | |
| *H01J 37/32* | (2006.01) | |
| *H01L 21/683* | (2006.01) | |
| *C23C 16/06* | (2006.01) | |
| *C23C 16/22* | (2006.01) | |

(52) U.S. Cl.
CPC ..... *H01L 21/67069* (2013.01); *H01J 37/32091* (2013.01); *H01L 21/6831* (2013.01)
USPC ... 118/715; 118/729; 156/345.51; 156/345.1; 16/221

(58) Field of Classification Search
USPC .................. 118/715, 729; 156/345.51, 345.1; 16/221
See application file for complete search history.

(56) References Cited

U.S. PATENT DOCUMENTS

| | | | | | |
|---|---|---|---|---|---|
| 3,641,973 | A | * | 2/1972 | Shrader ........................ | 118/719 |
| 3,892,198 | A | * | 7/1975 | Dobson ........................ | 118/730 |
| 4,094,722 | A | * | 6/1978 | Yamamoto et al. ....... | 156/345.35 |
| 4,145,990 | A | * | 3/1979 | Hochandel et al. ........... | 118/680 |
| 4,448,149 | A | * | 5/1984 | Brown et al. ................ | 118/500 |
| 4,556,471 | A | * | 12/1985 | Bergman et al. ......... | 204/298.41 |
| 4,663,009 | A | * | 5/1987 | Bloomquist et al. ....... | 204/192.2 |
| 6,050,446 | A | * | 4/2000 | Lei et al. ....................... | 220/819 |
| 6,517,634 | B2 | * | 2/2003 | Pang et al. .................... | 118/715 |
| 6,565,662 | B2 | * | 5/2003 | Amano et al. ................ | 118/715 |
| 6,573,184 | B2 | * | 6/2003 | Park .............................. | 438/680 |
| 6,776,848 | B2 | * | 8/2004 | Rosenstein et al. ........... | 118/726 |
| 6,866,746 | B2 | * | 3/2005 | Lei et al. .................. | 156/345.29 |
| 7,013,834 | B2 | * | 3/2006 | Tyler et al. ................. | 118/723 E |
| 7,101,442 | B2 | * | 9/2006 | Choi et al. .................... | 118/733 |
| 7,163,586 | B2 | * | 1/2007 | Christensen .................. | 118/719 |
| 7,371,285 | B2 | * | 5/2008 | Rosenstein et al. ........... | 118/715 |
| 7,416,633 | B2 | * | 8/2008 | Makino et al. ........... | 156/345.27 |
| 7,707,965 | B2 | * | 5/2010 | Yamashita ............ | 118/723 MW |

(Continued)

FOREIGN PATENT DOCUMENTS

JP    2001073138 A  *  3/2001  .............. C23C 14/50

OTHER PUBLICATIONS

JPO Machine Translation for JP 2001073138 A, Jun. 11, 2014.*

*Primary Examiner* — Rudy Zervigon

(57) ABSTRACT

A substrate processing apparatus includes: a chamber including a body having an open portion and a door for blocking the open portion; a substrate supporter connected to the door; and a door operating means including a rotation shaft for straightly moving and rotating the door, the door and the body separated in parallel from each other by straightly moving the door.

6 Claims, 5 Drawing Sheets

(56) References Cited

U.S. PATENT DOCUMENTS

| | | | |
|---|---|---|---|
| 7,708,860 B2* | 5/2010 | Arita et al. | 156/345.51 |
| 7,879,181 B2* | 2/2011 | Lee et al. | 156/345.31 |
| 8,202,575 B2* | 6/2012 | Monsma et al. | 427/255.7 |
| 8,333,166 B2* | 12/2012 | Bolden et al. | 118/723 E |
| 8,480,850 B2* | 7/2013 | Tyler et al. | 156/345.47 |
| 8,613,827 B2* | 12/2013 | Tyler et al. | 156/345.45 |
| 2001/0006094 A1* | 7/2001 | Amano et al. | 156/345 |
| 2001/0013504 A1* | 8/2001 | Imafuku et al. | 216/71 |
| 2001/0014268 A1* | 8/2001 | Bryson et al. | 414/217 |
| 2001/0023744 A1* | 9/2001 | Komino | 156/345 |
| 2001/0027843 A1* | 10/2001 | Komino et al. | 156/345 |
| 2002/0000198 A1* | 1/2002 | Ishikawa et al. | 118/715 |

* cited by examiner

SUBSTRATE PROCESSING APPARATUS AND METHOD OF DISASSEMBLING AND ASSEMBLING THE SAME

This application claims the benefit of Korean Patent Application No. 10-2010-0101357, filed on Oct. 18, 2010, which is hereby incorporated by a reference in its entirety.

TECHNICAL FIELD

The present disclosure relates to a substrate processing apparatus including a door, and more particularly, to a substrate processing apparatus where a substrate supporter is outputted from and inputted into a chamber by opening and closing the door and a method of disassembling and assembling the substrate processing apparatus.

BACKGROUND

In general, a semiconductor device, a display device and a solar cell are fabricated through a depositing process where a thin film is formed on a substrate, a photolithographic process where a thin film is selectively exposed and shielded by a photosensitive material and an etching process where a thin film is selectively removed. Among the fabricating processes, the deposition process and the etching process are performed in a substrate processing apparatus under an optimum vacuum state using a plasma.

A substrate processing apparatus includes a chamber providing a reaction space, a plasma electrode generating a plasma using a reaction gas in the reaction space and an electrostatic chuck supporting a substrate. The electrostatic chuck fixes the substrate using an electrostatic force and a lift pin moves up and down through the electrostatic chuck to load and unload the substrate. In addition, the electrostatic chuck includes a heater therein to heat the substrate up to a process temperature. Since the electrostatic chuck is combined with a power supply for applying the electrostatic force, a cooler and the lift pin, a periodic maintenance is required.

FIG. 1 is a cross-sectional view showing a substrate processing apparatus according to the related art. In FIG. 1, a substrate processing apparatus 10 includes a chamber 12, an electrostatic chuck 16, a gas distributing plate 18, a gas inlet pipe 20 and an exhausting port 22. The chamber 12 includes a lid 12a and a body 12b and provides a reaction space isolated from an exterior for processing the substrate. The electrostatic chuck 16 is disposed in the chamber 12 and a substrate 14 is disposed on the electrostatic chuck 16. The electrostatic chuck 16 includes a main body 24 of aluminum (Al), an insulating plate 26 of a ceramic material combined with an upper surface of the main body 24 and a direct current (DC) electrode 28 in the insulating plate 26. Since the DC electrode 28 is connected to a DC source 36 to generate an electrostatic force, the substrate 14 is stably fixed to the electrostatic chuck 16.

The electrostatic chuck 16 may further include a heater 30 for heating the substrate 14, a cooler (not shown) for cooling the substrate 14 and a lift pin (not shown) for loading and unloading the substrate 14. The main body 24 has a step difference portion 32 at a periphery thereof such that a top surface of the step difference portion 32 is lower than a top surface of a central portion of the main body 24 and a focus ring 34 is combined with the step difference portion 32. In addition, the main body 24 is connected to a radio frequency (RF) source 38 and a matcher 40 for matching impedance is disposed between the main body 24 and the RF source 38.

The gas distributing plate 18 is disposed to face into the electrostatic chuck 16 and supplies a process gas to an upper portion of the electrostatic chuck 16 having the substrate 14 thereon. The gas inlet pipe 20 is connected to the gas distributing plate 18 to supply the process gas. The exhausting port 22 exhausts a reaction gas and a residual material in the chamber 12 to the exterior.

In the substrate processing apparatus 10, as a process for the substrate 14 is repeated, components of the electrostatic chuck 16 may be abraded or damaged. Specifically, the lift pin, the heater 30, the cooler, the cooler, the DC electrode 28 and the DC source 36 may be deteriorated. Accordingly, the chamber 12 is required to be periodically disassembled and the electrostatic chuck 16 is required to be repaired or replaced for keeping a function of the electrostatic chuck 16.

In the substrate processing apparatus 10, however, after the lid 12a and the body 12b are separated from each other and the body 12b is disassembled, the electrostatic chuck 16 is outputted from the chamber 12. In addition, when maintenance of the electrostatic chuck 16 is completed, the chamber 12 is assembled in reverse order of disassembling. As a result, it takes much time to assemble and disassemble the chamber 12 for outputting the electrostatic chuck 16 and an operational efficiency of the substrate processing apparatus 10 is reduced.

SUMMARY

Accordingly, the present disclosure is directed to a substrate processing apparatus and a method of disassemble and assemble the same that substantially obviate one or more of the problems due to limitations and disadvantages of the related art.

An object of the present disclosure is to provide a substrate processing apparatus where a substrate supporter is outputted from and inputted into a chamber by opening and closing a door and a method of disassembling and assembling the substrate processing apparatus Another object of the present disclosure is to provide a substrate processing apparatus where a chamber includes a lid, a body, a door connected to a substrate supporter and a door operating means for opening and closing the door and a method of disassembling and assembling the substrate processing apparatus.

To achieve these and other advantages and in accordance with the purpose of the present invention, as embodied and broadly described, a substrate processing apparatus includes: a chamber including a body having an open portion and a door for blocking the open portion; a substrate supporter connected to the door; and a door operating means including a rotation shaft for straightly moving and rotating the door, the door and the body separated in parallel from each other by straightly moving the door.

In another aspect, a method of disassembling a substrate processing apparatus that includes a chamber including a body having an open portion and a door for blocking the open portion, a substrate supporter connected to the door and a door operating means for opening and blocking the open portion by rotating the door includes: straightly moving the door so that the door is separated from the body; and rotating the door so that the substrate supporter connected to the door is outputted from the chamber.

In another aspect, a method of disassembling a substrate processing apparatus that includes a chamber including a body having an open portion and a door for blocking the open portion, a substrate supporter connected to the door and a door operating means for opening and blocking the open portion by rotating the door includes: rotating the door so that the substrate supporter connected to the door is inputted into the chamber; and straightly moving the door so that the door contacts the body.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention.

In the drawings.

DETAILED DESCRIPTION OF THE PREFERRED EMBODIMENTS

Reference will now be made in detail to embodiments which are illustrated in the accompanying drawings. Wherever possible, similar reference numbers will be used to refer to the same or similar parts.

Figure 1:
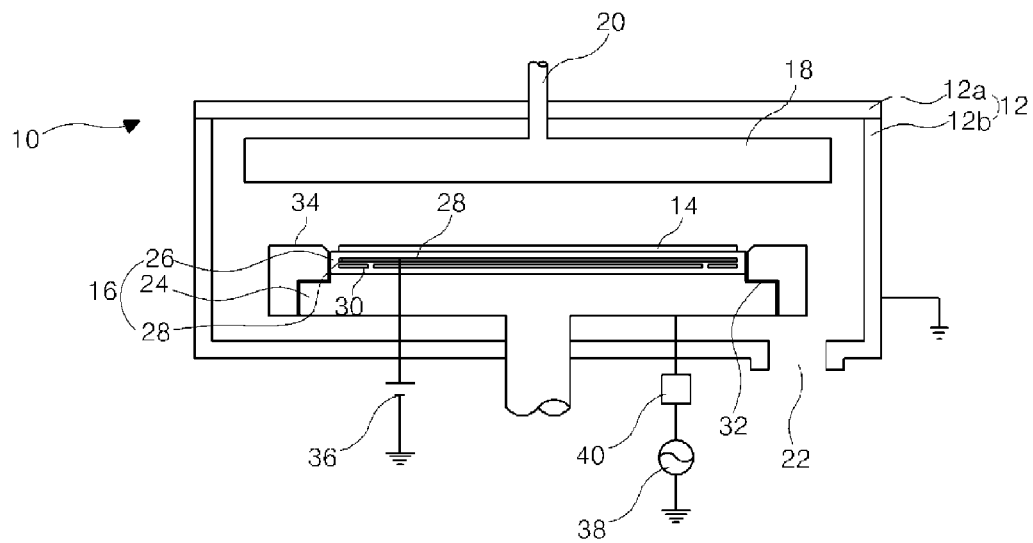
FIG. 1 is a cross-sectional view showing a substrate processing apparatus according to the related art.
Figure 2:
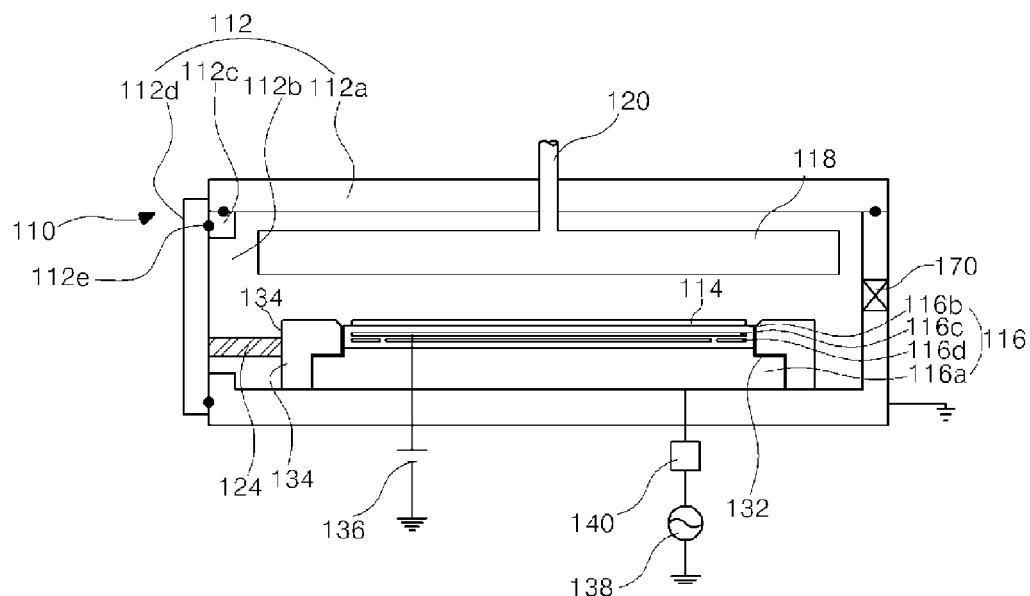
FIG. 2 is a cross-sectional view showing a substrate processing apparatus according to an embodiment of the present invention.

FIG. 2 is a cross-sectional view showing a substrate processing apparatus according to an embodiment of the present invention.

In FIG. 2, a substrate processing apparatus 110 includes a chamber 112, a substrate supporter 116, a gas distributing plate 118, a gas inlet pipe 120 and a gate valve 170. The chamber 112 includes a lid 112a, a body 112c having an open portion 112b at one side thereof and a door 112d for blocking the open portion 112b. The gate valve 170 may be formed at a sidewall of the body 112c for transferring a substrate 114 and may be disposed to face into the open portion 112b.

The door 112d and the substrate supporter 116 are connected to each other through a connecting means 124. As a result, the substrate supporter 116 connected to the door 112d is outputted from or inputted from the chamber 112 according to opening or closing of the door 112d. The door 112d may have a size capable of blocking the open portion 112b and an O-ring 112e may be disposed between the door 112d and the body 112c to surround the open portion 112b.

The chamber 112 that is constituted by assembling the lid 112a, the body 112c and the door 112d provides a reaction space isolated from an exterior for processing the substrate 114. An exhaust port (not shown) may be formed on the body 112c for evacuating the chamber 112 and exhausting a reaction gas.

The substrate supporter 116 may be disposed inside the chamber 112 and the substrate 114 may be loaded on the substrate supporter 116. Since the substrate supporter 116 is connected to the door 112d, the substrate supporter 116 is outputted from or inputted into the chamber 112 according to opening or closing of the door 112d. As a result, the substrate supporter 116 is formed to be disassembled from the chamber 112 or to be capable of being disassembled from the chamber 112.

The substrate supporter 116 includes a main body 116a, an insulating plate 116b, a direct current (DC) electrode) 16c and a heater 116d. The main body 116a may include aluminum (Al), and the insulating plate 116b may include a ceramic material. The insulating plate 116b is combined with an upper surface of the main body 116a. The DC electrode 116c is formed in the insulating plate 116b, and the heater 116d for heating up the substrate 114 is disposed under the DC electrode 116d.

The DC electrode 116 is connected to a DC source 136. When a DC voltage of the DC source 136 is applied to the DC electrode 116c, an electrostatic force is generated and the substrate 114 is stably fixed to the substrate supporter 116 by the electrostatic force. The main body 116a is connected to a radio frequency (RF) source 138 and a matcher 140 for matching impedance is disposed between the main body 116a and the RF source 138.

Although not show, the substrate supporter 116 may further include a lift pin for loading and unloading the substrate 114 and a cooler for cooling the substrate 114. The cooler may be formed in the insulating plate 116b to include a path for a refrigerant of a relatively low temperature. The main body 116a has a step difference portion 132 at a periphery thereof such that a top surface of the step difference portion 132 is lower than a top surface of a central portion of the main body 116a and a focus ring 134 of a ceramic material is combined with the step difference portion 132. Since the focus ring 134 extends a plasma generating region between the gas distributing plate 118 and the substrate supporter 116 outside the substrate supporter 116, a uniformity of plasma is improved over the substrate 114.

Figure 3:
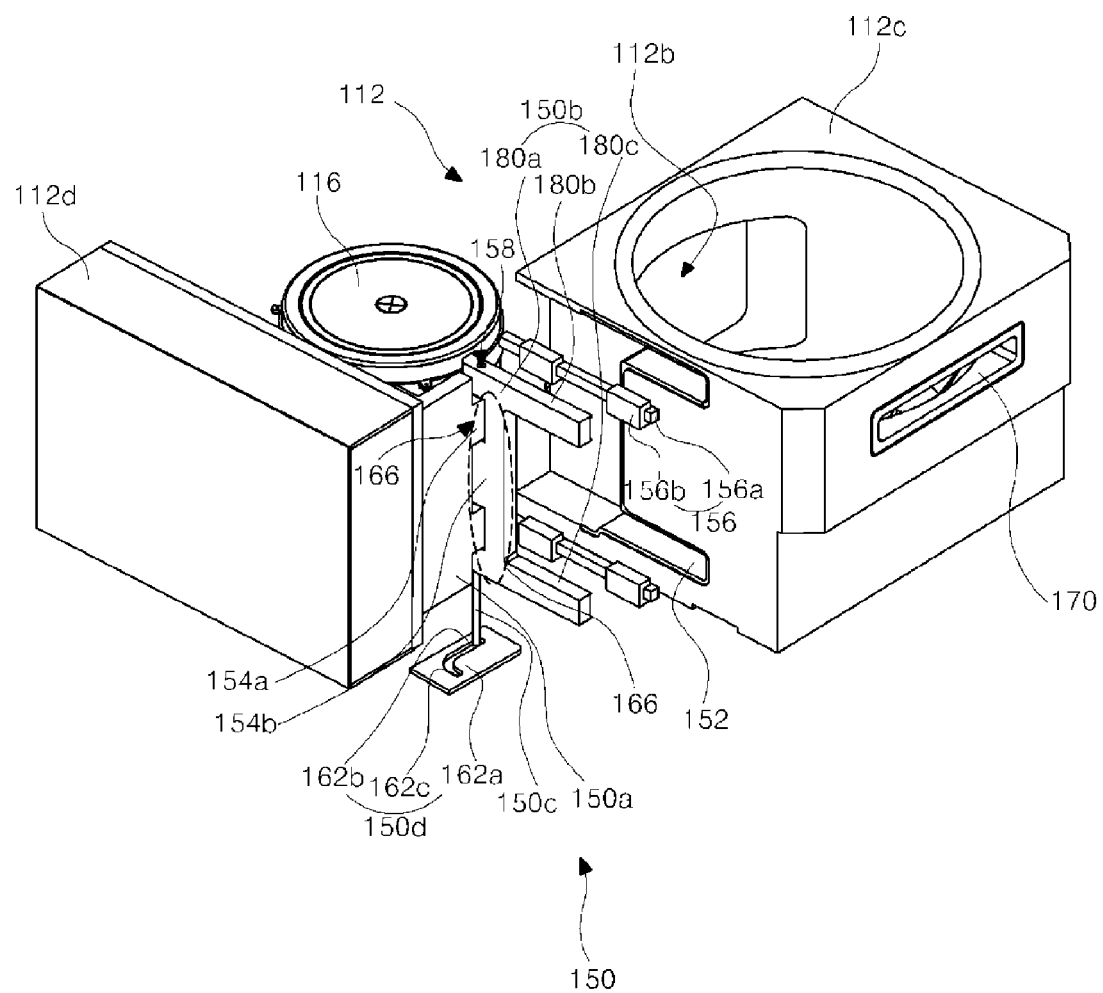
FIG. 3 is an exploded perspective view showing a substrate processing apparatus according to an embodiment of the present invention.

FIG. 3 is an exploded perspective view showing a substrate processing apparatus according to an embodiment of the present invention. For convenience of illustration, the lid 112a (of FIG. 2) is omitted in FIG. 3.

In FIG. 3, a door operating means 150 connecting the body 112c and the door 112d is formed for outputting the substrate supporter 116 from or inputting the substrate supporter 116 into the chamber 112 through the open portion 112b. When the substrate supporter 116 is inputted into the chamber 112, the body 112c adjacent to the open portion 112b and the door 112d are sealed with the O-ring 112e (of FIG. 2) interposed therebetween.

The door operating means 150 includes a leading part 150a, a clamping part 150b, a rotation shaft 150c and a guide plate 150d. The body 112c has a concave portion 152 where the leading part 150a and the clamping part 150b are inserted. When the leading part 150a and the clamping part 150b are inserted into the concave portion 152, the leading part 150a and the clamping part 150b do not protrude from a side surface of the body 112c. Accordingly, the leading part 150a and the clamping part 150b are protected from an object moving adjacent to the chamber 112. In addition, although the leading part 150a rotates around the rotation shaft 150c, application of surrounding space of the chamber 112 is improved because the leading part 150a and the clamping part 150b do not protrude from the side surface of the body 112c.

One end of the leading part 150a is fixed to an end of the door 112d and the other end of the leading part 150a is connected to the clamping part 150b. A first uneven portion 154a having a concave portion and a convex portion is formed at the other end of the leading part 150a. In addition, a guiding means 156 for guiding a horizontal straight movement of the clamping part 150b is formed in the concave portion 152. For example, an LM guide may be used as the guiding means 156. The guiding means 156 is formed at upper and lower positions of the concave portion 152. The guiding means includes a bar 156a fixed in the concave portion 152 and a plurality of blocks 156b straightly movable along the bar 156a.

The clamping part 150b is fixed to the plurality of blocks 156b of the guiding means 156. When the leading part 150a straightly moves for disassembling or assembling the door 112d and the body 112c, the clamping part 150b straightly moves along the guiding means 156. Further, a second uneven portion 154b having a concave portion and a convex portion is formed at one end of the clamping part 150b. The second uneven portion 154b corresponds to the first uneven portion 154a.

Since the clamping part 150b straightly moves along the guiding means 156, it is required that a weight of the clamping part 150b is minimized. Accordingly, the clamping par 150b may include a first portion 180a connected to the leading part 150a and upper and lower portions 180b and 180c horizontally extending from upper and lower regions of the first portion 180a. The guiding means 156 at the upper position of the concave portion 152 is connected to the upper region of the first portion 180a and the upper portion 180b of the clamping part 150b, and the guiding means 156 at the lower position of the concave portion 152 is connected to the lower region of the first portion 180a and the lower portion 180c of the clamping part 150b. The first portion 180a of the clamping part 150b may be flush with the leading part 150a.

The concave portion 152 has a shape corresponding to a shape of the leading part 150a and the clamping part 150b. For example, the concave portion 152 may include a first concave portion corresponding to the leading part 150a and the first portion 180a of the clamping part 150b and a second concave portion corresponding to the upper and lower portions 180b and 180c of the clamping part 150b.

When the first uneven portion 154a of the leading part 150a and the second uneven portion 154b of the clamping part 150b are combined with each other, a through hole 158 penetrating a center of the combined first and second uneven portions 154a and 154b is formed and the rotation shaft 150c is inserted into the through hole 158. Upper and lower portions of the rotation shaft 150c are fixed to upper and lower portions of the clamping part 150b. In addition, the rotation shaft 150c protrudes from a combination region 166 where the first and second uneven portions 154a and 154b are combined to be guided by the guiding plate 150d.

The guiding plate 150d is disposed under the leading part 150a and the combination region 166 and guide the rotation shaft 150c through a moving path. The guiding plate 150d includes a plate 162a, a straight guiding hole 162b in the plate 162a and a circular guiding hole 162c connected to the straight guiding hole 162b. The straight guiding hole 162b is disposed adjacent to the clamping part 150b and the circular guiding hole 162c is disposed adjacent to the clamping part 150a. The straight guiding hole 162b guides the rotation shaft 150c such that the rotation shaft 150c straightly moves, and the circular guiding hole 162c guides the rotation shaft 150c such that the rotation shaft 150c circularly moves when the leading part 150a rotates around the rotation shaft 150c. The rotation shaft 150c in the straight guiding hole 162b and the circular guiding hole 162c is separated from a lower portion of the concave portion 152 so that the rotation shaft 150c can move with ease.

When the door 112d blocks the open portion 112b of the body 112c, the rotation shaft 150c protruding from the combination region 166 is disposed in the straight guiding hole 162b closest to the clamping part 150b. In addition, when the door 112d is pulled out toward an exterior direction of the chamber 112, the rotation shaft 150c straightly moves along the straight guiding hole 162b of the guiding plate 162 together with the leading part 150a and the clamping part 150b. After the rotation shaft 150c straightly moves, the rotation shaft 150 stops at a point where the straight guiding hole 162b and the circular guiding hole 162c meet. A straight distance where the rotation shaft 150c moves along the straight guiding hole 162b is the same as a straight distance where the door 112d moves outward from the body 112c. After the rotation shaft 150c stops at the point where the straight guiding hole 162b and the circular guiding hole 162c meet, the rotation shaft 150c moves along the circular guiding hole 162c and the door 112d rotates around the rotation shaft 150c.

Figure 4A:
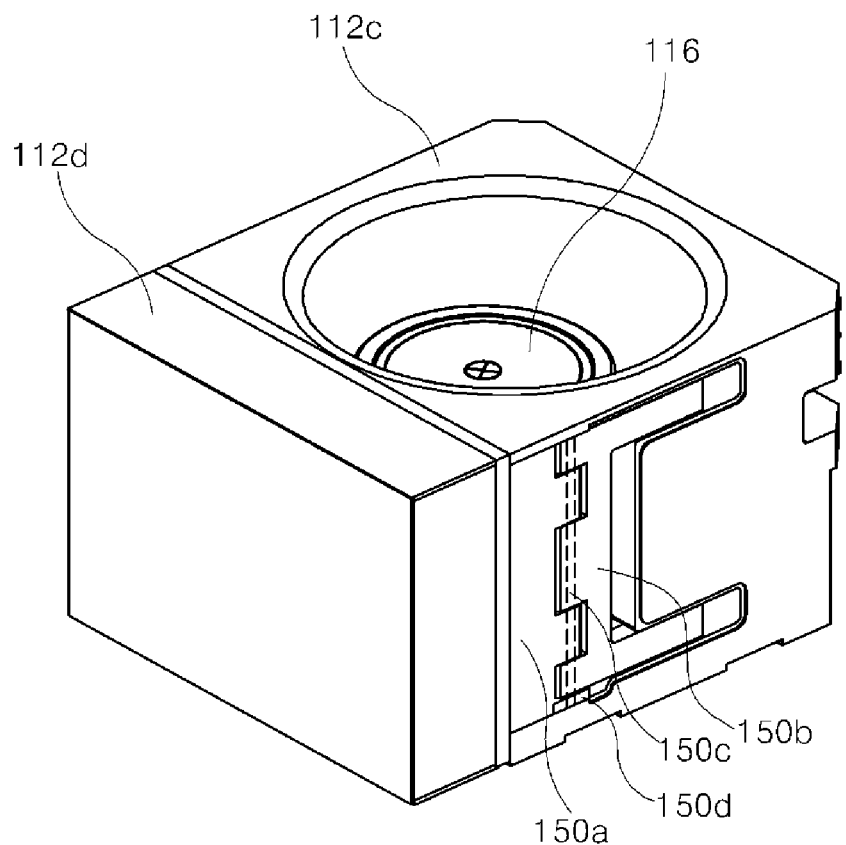
FIGS. 4A to 4C are perspective views showing a method of disassembling a substrate processing apparatus according to an embodiment of the present invention.
Figure 4B:
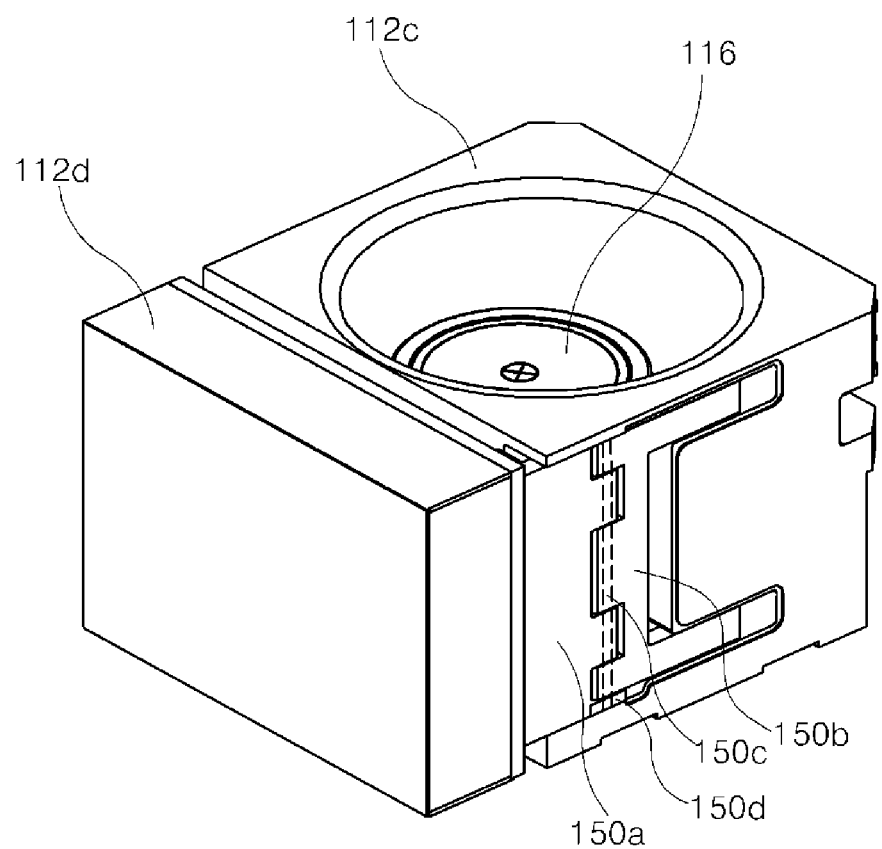
Figure 4C:
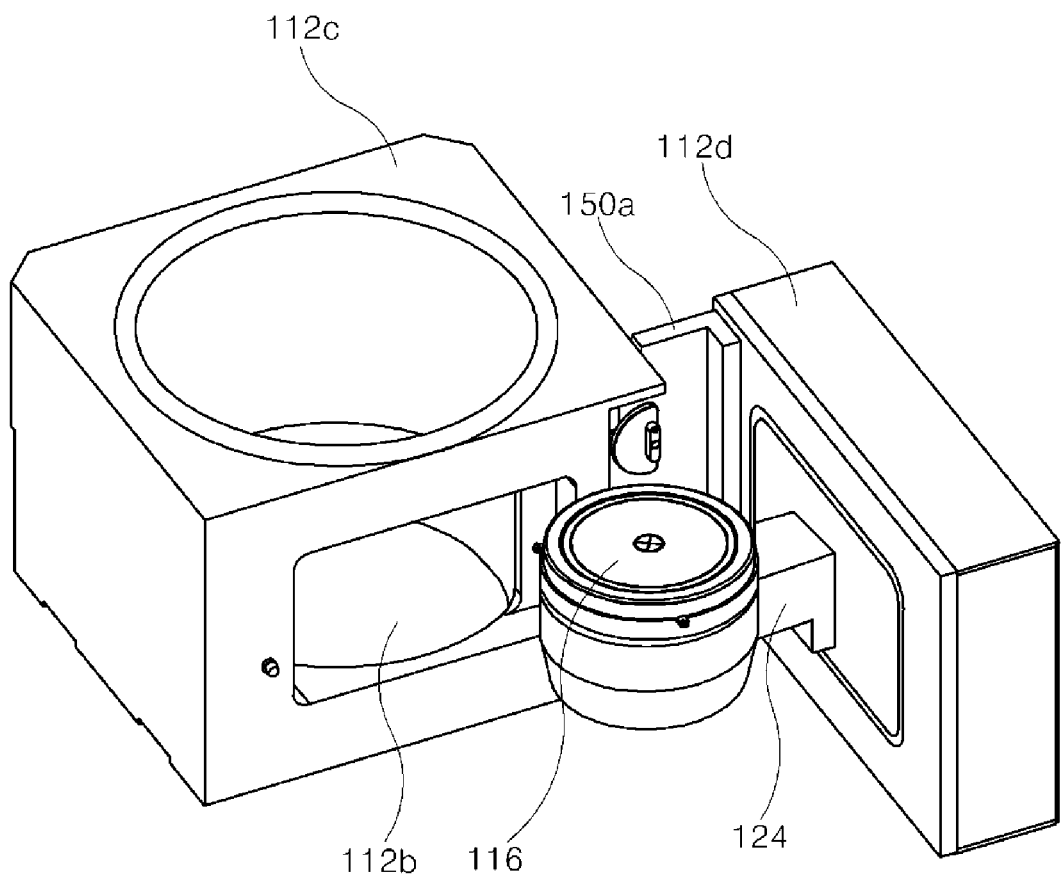

FIGS. 4A to 4C are perspective views showing a method of disassembling a substrate processing apparatus according to an embodiment of the present invention. For convenience of illustration, the lid 112a (of FIG. 2) is omitted in FIGS. 4A to 4C.

In FIG. 4A, the lid 112a (of FIG. 2), the door 112d and the body 112c of the chamber 112 are assembled such that the door 112d blocks the open portion 112b of the body 112c and a process for a substrate is performed in the chamber 112. As the process for the substrate is repeated, components of the substrate supporter 116 such as the lift pin (not shown) may be abraded or damaged. In addition, when the substrate supporter 116 is abraded or damaged, the substrate supporter 116 is required to be outputted from the chamber 112 for replacement or repair of the substrate supporter 116.

In FIG. 4B, when the door 112d is pulled out toward the exterior direction of the chamber 112, the door 112d is disassembled from the body 112c with an equidistance between the door 112d and the body 112c through the whole door 112d. As a result, the door 112d and the body 112c are separated in parallel from each other.

The disassembling operation will be illustrated in detail hereinafter referring to FIG. 3. When the door 112d connected to the leading part 150a is pulled out toward the exterior direction of the chamber 112, the rotation shaft 150c connecting the leading part 150a and the clamping part 150b moves along the straight guiding hole 162b of the guiding plate 150d and the clamping part 150b moves along the guiding means 156. The rotation shaft 150c stops moving at the point where the straight guiding hole 162b and the circular guiding hole 162c meet. A straight distance where the leading part 150a moves outward from the body 112b is the same as a distance of the straight guiding hole 162b. For example, a gap distance between the door 112d and the body 112c due to the straight movement of the leading part 150a may be about 40 mm for the substrate of 12-inch wafer.

In FIG. 4C, after the door 112d is separated from the body 112c due to the straight movement, the door 112d connected to the leading part 150a rotates around the rotation shaft 150c. When the rotation shaft 150c moves along the circular guiding hole 162c of the guiding plate 150d, the door 112d rotates such that the door 112d is completely opens and the open portion 112b is fully open. In addition, the substrate supporter 116 connected to the door 112d is outputted from the chamber 112 through the open portion 112b. Although a rotation angle of the door 112d is about 90° in FIG. 4C, the rotation angle of the door 112d may be adjusted by changing the design of the circular guiding hole 162c of the guiding plate 150d in another embodiment.

If the door 112d rotates in a state where the door 112d is not separated from the body 112c, the door 112d, the body 112c and the O-ring 112e (of FIG. 2) between the door 112d and the body 112c may be damaged because a rotation space for the leading part 150a connected to the rotation shaft 150c is not provided. In an embodiment of the present invention, since the door 112d rotates after the door 112d is separated from the body 112c by the straight movement, the damages of the door 112d, the body 112c and the O-ring 112e are prevented while the chamber 112 is disassembled.

After the substrate supporter 116 outputted from the chamber 112 is repaired or replaced, the door 112d rotates such that the door 112d closes and the open portion 112b is blocked.

The assembling operation will be illustrated in detail hereinafter referring to FIGS. 3 and 4A to 4C. After the substrate supporter 116 is repaired or replaced in a state where the open portion 112b of the chamber 112 is open due to rotation of the door 112d around the rotation shaft 150c as shown in FIG. 4C, the door 112d connected to the leading part 150a rotates around the rotation shaft 150c. According to the rotation of the door 112d, the rotation shaft 150c moves along the circular guiding hole 162 of the guiding plate 150d and the door 112d stops rotating at the point where the circular guiding hole 162c and the straight guiding hole 162b meet. When the rotation of the door 112d stops, the door 112d and the body 112c are separated in parallel from each other as shown in FIG. 4B.

When the door 112d is pushed in toward an interior direction of the chamber 112 in a state where the door 112d and the body 112c are separated in parallel from each other as shown in FIG. 4B, the door 112d contacts the body 112c. According to the straight movement of the door 112d toward the body 112c, the rotation shaft 150c connecting the leading part 150a and the clamping part 150b moves along the straight guiding hole 162b of the guiding plate 150d. After the contact of the door 112d and the body 112c is completed, the chamber has a state where the process for the substrate can be performed as shown in FIG. 4A.

Consequently, in a substrate processing apparatus according to the present invention, since a chamber is constituted by a lid, a body, a door connected to a substrate supporter and a door operating means for opening and closing the door, the substrate supporter is outputted from and inputted into the chamber by opening and closing the door. As a result, maintenance procedure and replacement procedure of the substrate supporter are improved.

It will be apparent to those skilled in the art that various modifications and variations can be made in a substrate processing apparatus and a method of disassembling and assembling the substrate processing apparatus of the present invention without departing from the spirit or scope of the invention. Thus, it is intended that the present invention cover the modifications and variations of this invention provided they come within the scope of the appended claims and their equivalents.

What is claimed is:

1. A substrate processing apparatus, comprising:
a chamber including a body having an open portion and a door for blocking the open portion;
a substrate supporter connected to the door;
a door operating means including a rotation shaft for moving straightly and rotating the door, the door and the body separated in parallel from each other by moving straightly the door; and
a guiding plate for guiding the rotation shaft to move straightly and rotate,
wherein the door operating means further comprises:
a leading part connected to the door; and
a clamping part connected to the leading part and formed on a side surface of the chamber,
wherein the rotation shaft connects the leading part and the clamping part and the leading part is configured to rotate around the rotation shaft, and
wherein the guiding plate includes a straight guiding hole for guiding the rotation shaft to move straightly and a circular guiding hole for guiding the rotation shaft to move according to a rotation of the leading part.

2. The substrate processing apparatus according to claim 1, wherein the straight guiding hole and the circular guiding hole correspond to the clamping part and the leading part, respectively.

3. A substrate processing apparatus, comprising:
a chamber including a body having an open portion and a door for blocking the open portion;
a substrate supporter connected to the door; and
a door operating means including a rotation shaft for moving straightly and rotating the door, the door and the body separated in parallel from each other by moving straightly the door,
wherein the door operating means further comprises:
a leading part connected to the door; and
a clamping part connected to the leading part and formed on a side surface of the chamber,
wherein the rotation shaft connects the leading part and the clamping part and the leading part is configured to rotate around the rotation shaft, and
wherein the leading part includes a first uneven portion at an end thereof and the clamping part includes a second uneven portion at an end thereof, and wherein the leading part and the clamping part combined with each other by inserting the rotation shaft into a through hole constituted by the first and second uneven portions.

4. The substrate processing apparatus according to claim 1, wherein the body includes a concave portion where the leading part and the clamping part are formed.

5. The substrate processing apparatus according to claim 4, wherein a guiding means for guiding the clamping part to move straightly is formed in the concave portion.

6. The substrate processing apparatus according to claim 5, wherein the guiding means includes a bar fixed in the concave portion and a plurality of blocks movable straightly along the bar, and wherein the clamping part is fixed to the plurality of blocks.

* * * * *